United States Patent
Jung et al.

(10) Patent No.: US 10,361,141 B2
(45) Date of Patent: Jul. 23, 2019

(54) SEMICONDUCTOR PACKAGES RELATING TO THERMAL TRANSFER PLATE AND METHODS OF MANUFACTURING THE SAME

(71) Applicant: SK hynix Inc., Icheon-si, Gyeonggi-do (KR)

(72) Inventors: Yeon Seung Jung, Suwon-si (KR); Jong Hoon Kim, Suwon-si (KR); Jin Woo Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/017,118

(22) Filed: Jun. 25, 2018

(65) Prior Publication Data

US 2019/0148256 A1 May 16, 2019

(30) Foreign Application Priority Data

Nov. 16, 2017 (KR) .................. 10-2017-0153368

(51) Int. Cl.
*H01L 23/367* (2006.01)
*H01L 23/00* (2006.01)
*H01L 21/768* (2006.01)
*H05K 1/02* (2006.01)

(52) U.S. Cl.
CPC ...... *H01L 23/367* (2013.01); *H01L 21/76802* (2013.01); *H01L 24/09* (2013.01); *H01L 24/32* (2013.01); *H05K 1/0203* (2013.01); *H01L 2224/02373* (2013.01)

(58) Field of Classification Search
CPC . H01L 23/367; H01L 21/76802; H01L 24/32; H01L 24/09; H01L 33/64; H01L 23/49568; H05K 1/0203; H01H 1/504
See application file for complete search history.

(56) References Cited

U.S. PATENT DOCUMENTS

| 8,482,120 | B2 | 7/2013 | Jafari et al. |
| 8,865,521 | B2 | 10/2014 | Jeng et al. |
| 9,082,633 | B2 * | 7/2015 | Grant .................. H01L 23/3675 |

* cited by examiner

*Primary Examiner* — William Coleman
(74) *Attorney, Agent, or Firm* — William Park & Associates Ltd.

(57) ABSTRACT

A semiconductor package and a method of manufacturing the semiconductor package may be provided. The semiconductor package may include a first semiconductor chip disposed on a first surface of an interconnection layer, a second and a third semiconductor chips disposed on a second surface of the interconnection layer. The semiconductor package may include a thermal transfer plate disposed between the second and third semiconductor chips, contacting the second surface of the interconnection layer, and overlapping with the first semiconductor chip. The thermal transfer plate may be configured to provide a heat radiation path.

20 Claims, 15 Drawing Sheets

US 10,361,141 B2

SEMICONDUCTOR PACKAGES RELATING TO THERMAL TRANSFER PLATE AND METHODS OF MANUFACTURING THE SAME

CROSS-REFERENCE TO RELATED APPLICATIONS

The present application claims priority under 35 U.S.C 119(a) to Korean Application No. 10-2017-0153368, filed on Nov. 16, 2017, which is incorporated herein by references in its entirety.

BACKGROUND

1. Technical Field

The present disclosure generally relates to semiconductor package technologies and, more particularly, to semiconductor packages relating to thermal transfer plate and methods of manufacturing the same.

2. Related Art

Semiconductor packages have been employed in electronic systems such as mobile phones or computers. A lot of effort has been focused on integrating a plurality of semiconductor chips into a single package such that the single package performs a multi-functional operation while still being able to process a large amount of data at high speeds. For example, 2.5-dimensional (2.5D) system-in-package (SIP) techniques have been proposed to dispose a processor chip and a memory chip side-by-side on an interposer. Since various types of semiconductor chips are embedded in the single package, a cooling structure for radiating heat generated by a specific semiconductor chip in the single package may be required to prevent performance of the single package from being degraded.

SUMMARY

According to an embodiment, a semiconductor package may include a first semiconductor chip disposed on a first surface of an interconnection layer. The semiconductor package may include a second and a third semiconductor chips spaced apart from each other and disposed on a second surface of the interconnection layer. The semiconductor package may include a thermal transfer plate disposed between the second and third semiconductor chips, contacting contact the second surface of the interconnection layer, and overlapping with the first semiconductor chip. The thermal transfer plate may provide a heat radiation path.

According to an embodiment, a semiconductor package may include a first semiconductor chip disposed on a first surface of an interconnection layer. The semiconductor package may include second semiconductor chips disposed on a second surface of the interconnection layer so that four corner regions of the first semiconductor chip respectively overlap with edge regions of the second semiconductor chips. The semiconductor package may include a thermal transfer plate disposed between the second semiconductor chips to contact the second surface of the interconnection layer and to overlap with the first semiconductor chip. The thermal transfer plate may provide a heat radiation path.

According to an embodiment there is provided a method of manufacturing a semiconductor package. The method may include disposing a thermal transfer plate between a second and a third semiconductor chips. The method may include forming a molding layer for fixing the second and the third semiconductor chips and the thermal transfer plate. The method may include forming an interconnection layer on the second semiconductor chip and the thermal transfer plate so that a second surface of the interconnection layer is in contact with the second semiconductor chip and the thermal transfer plate. The method may include disposing a first semiconductor chip on a first surface of the interconnection layer to overlap with the thermal transfer plate.

DETAILED DESCRIPTION

Figure 1:
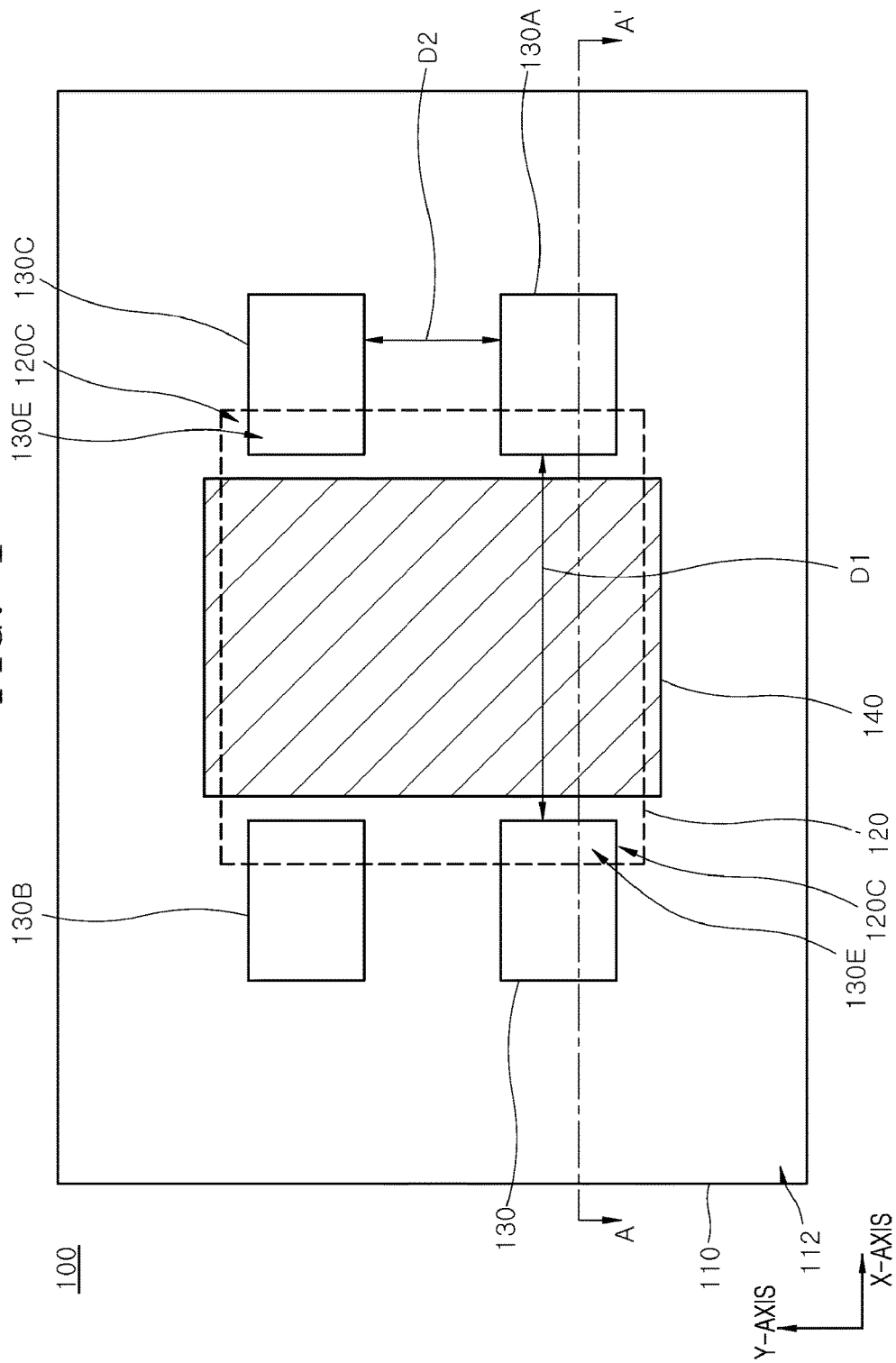
FIG. 1 is a plan view illustrating a semiconductor package according to an embodiment.

The terms used herein may correspond to words selected in is consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first/" "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

The present disclosure may provide semiconductor packages, each of which may be configured to include a plurality of semiconductor chips that are three-dimensionally stacked on and under an interconnection layer and a thermal transfer plate that may be disposed to vertically overlap with any one of the plurality of semiconductor chips and to contact the interconnection layer.

Figure 2:
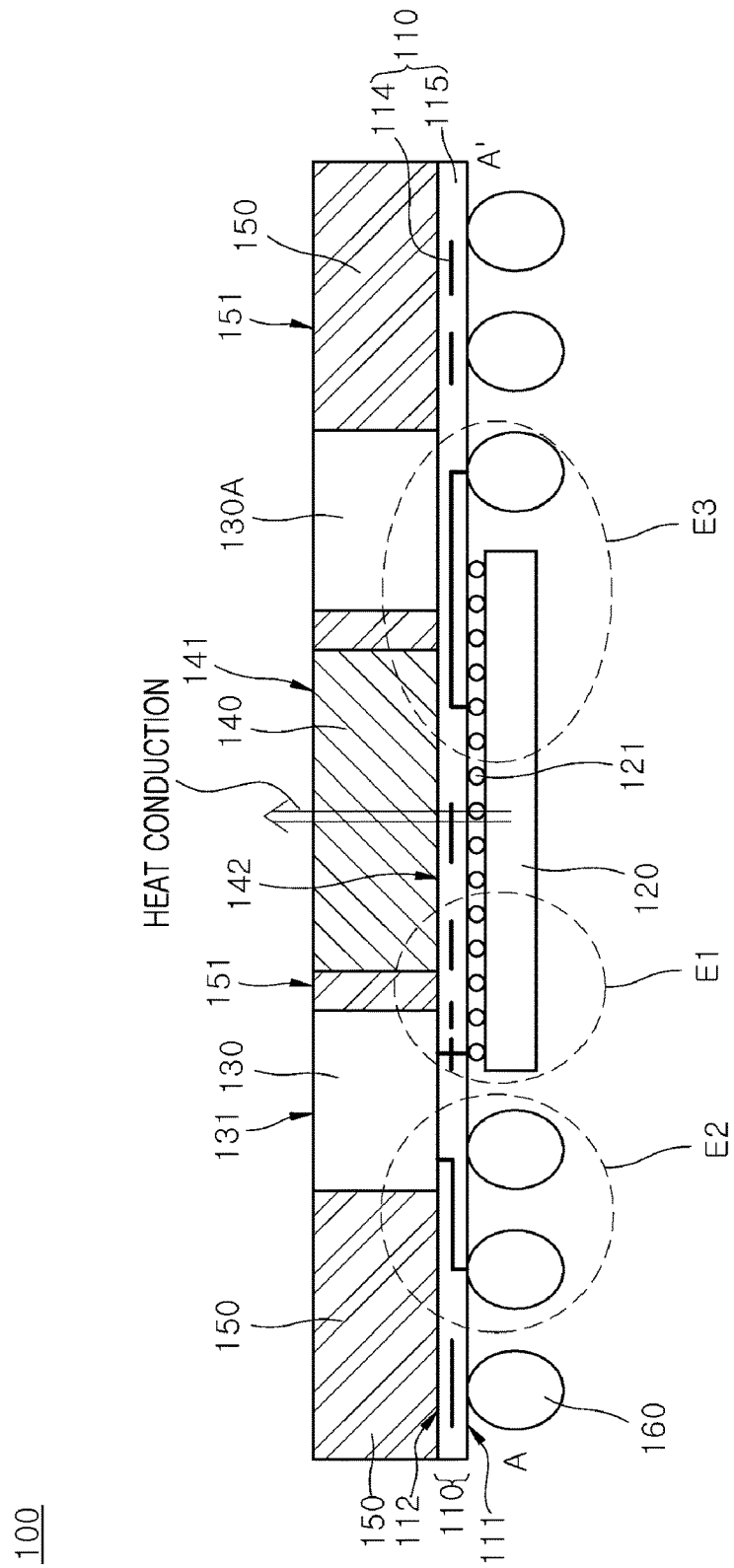
FIG. 2 is a cross-sectional view taken along a line A-A' of FIG. 1.

FIG. 1 is a plan view illustrating a semiconductor package 100 according to an embodiment. FIG. 2 is a cross-sectional view taken along a line A-A' of FIG. 1.

Referring to FIGS. 1 and 2, the semiconductor package 100 may include a first semiconductor chip 120, a second semiconductor chip 130, and an interconnection layer 110 disposed between the first and second semiconductor chips 120 and 130. The interconnection layer 110 may have a first surface 111 and a second surface 112 which are opposite to each other. The first semiconductor chip 120 may be disposed on the first surface 111 (corresponding to a bottom surface in FIG. 2) of the interconnection layer 110. The first semiconductor chip 120 may be connected to the first surface 111 of the interconnection layer 110 through inner connectors 121. The inner connectors 121 may be microbumps having a relatively small size. The second semiconductor chip 130 may be disposed on the second surface 112 (corresponding to a top surface in FIG. 2) of the interconnection layer 110.

A third semiconductor chip 130A may be additionally disposed on the second surface 112 of the interconnection layer 110 to be laterally spaced apart from the second semiconductor chip 130. A fourth semiconductor chip 130B and a fifth semiconductor chip 130C may also be disposed on the second surface 112 of the interconnection layer 110 to be laterally spaced apart from the second semiconductor chip 130. A thermal transfer plate 140 may be disposed on the second surface 112 of the interconnection layer 110 opposite to the first semiconductor chip 120 to vertically overlap with the first semiconductor chip 120. All of the second to fifth semiconductor chips 130, 130A, 130B and 130C and the thermal transfer plate 140 may be disposed to contact the second surface 112 of the interconnection layer 110. The thermal transfer plate 140 may have a bottom surface 142 that contacts the second surface 112 of the interconnection layer 110.

The thermal transfer plate 140 may be disposed between the second semiconductor chip 130 and the third semiconductor chip 130A. when viewed from a plan view of FIG. 1, a first distance D1 between the second semiconductor chip 130 and the third semiconductor chip 130A in an X-axis direction may be set to be greater than a second distance D2 between the second semiconductor chip 130 and the fourth semiconductor chip 130B in a Y-axis direction perpendicular to the X-axis direction. The thermal transfer plate 140 may be disposed between the second and third semiconductor chips 130 and 130A which are spaced apart from each other by the first distance D1 and may extend into a space between the fourth and fifth semiconductor chips 130B and 130C which are spaced apart from each other by the first distance D1. Accordingly, the thermal transfer plate 140 may be substantially located to vertically overlap with most of the first semiconductor chip 120. As a result, each of the second to fifth semiconductor chips 130, 130A, 130B and 130C may have an edge region 130E which overlaps with to any one of four corner regions 120C of the first semiconductor chip 120 or a portion adjacent to any one of the four corner regions 120C of the first semiconductor chip 120.

Referring again to FIG. 2, the semiconductor package 100 may further include a molding layer 150 covering the second surface 112 of the interconnection layer 110. The molding layer 150 may not be disposed on the first surface 111 of the interconnection layer 110. Outer connectors 160 instead of the molding layer 150 may be disposed on the first surface 111 of the interconnection layer 110 to connect the semiconductor package 100 to an external device. The outer connectors 160 may include solder balls having a size which is greater than the inner connectors 121. The molding layer 150 may include an encapsulant such as an epoxy molding compound (EMC) material.

The second to fifth semiconductor chips 130, 130A, 130B and 130C and the thermal transfer plate 140 may be disposed in the molding layer 150. In such a case, the molding layer 150 may be formed to have a top surface 151 which is located at the same level as a top surface 131 of the second semiconductor chip 130. That is, the top surface 131 of the second semiconductor chip 130 may be exposed at the same level as the top surface 151 of the molding layer 150. In addition, a top surface 141 of the thermal transfer plate 140 may also be exposed at the same level as the top surface 151 of the molding layer 150. The molding layer 150 may be formed to cover and protect side surfaces of the second and third semiconductor chips 130 and 130A and to fill a gap between the second semiconductor chip 130 and the thermal transfer plate 140 as well as a gap between the third semiconductor chip 130A and the thermal transfer plate 140.

Thus, the thermal transfer plate 140 may be disposed to substantially penetrate a portion of the molding layer 150 between the second semiconductor chip 130 and the third semiconductor chip 130A. That is, the thermal transfer plate 140 may provide a heat radiation path (i.e., a heat conduction path) that extends from the second surface 112 of the interconnection layer 110 to reach a level of the top surface 151 of the molding layer 150.

Figure 3:
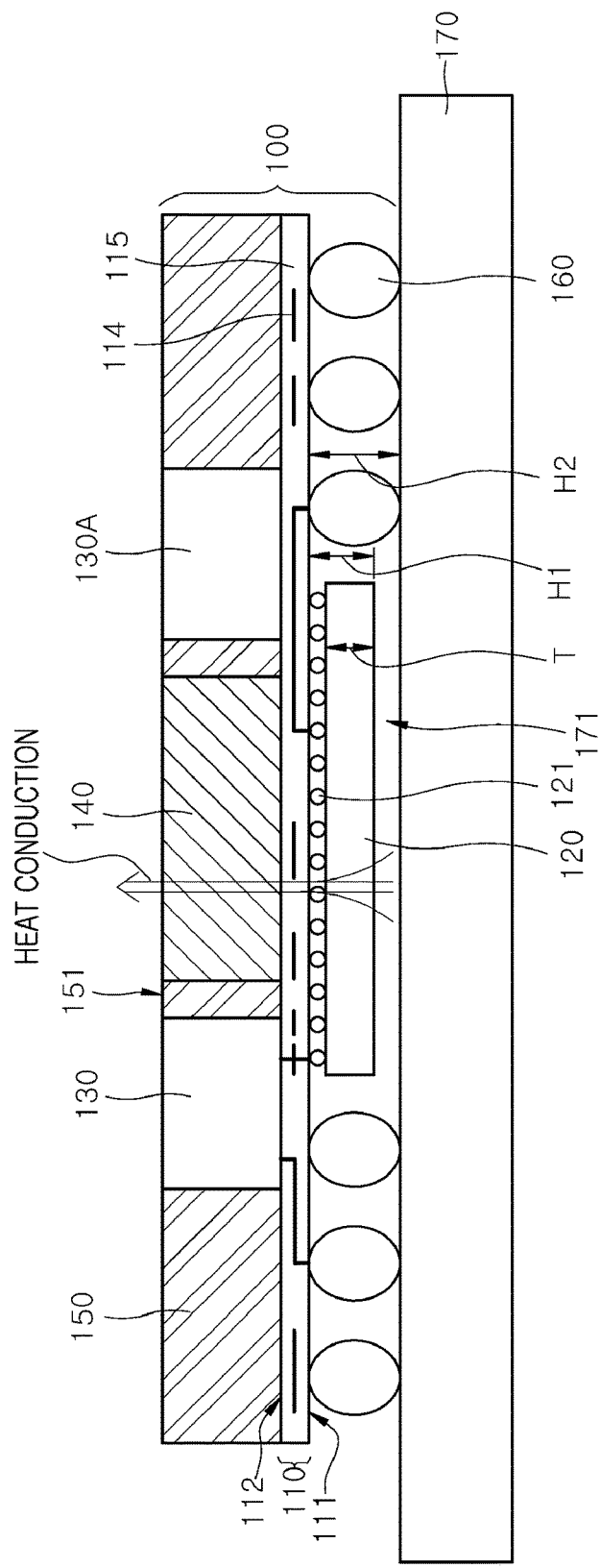
FIG. 3 is a cross-sectional view illustrating a heat conduction path of the semiconductor package illustrated in FIG. 2.

FIG. 3 is a cross-sectional view illustrating a heat conduction path of the semiconductor package 100 illustrated in FIG. 2.

Referring to FIG. 3, the semiconductor package 100 may be mounted on a circuit substrate 170. The circuit substrate 170 may be a printed circuit board (PCB) or a main board that includes circuit patterns. For example, the semiconductor package 100 may be connected to the circuit substrate 170 through the outer connectors 160. The first semiconductor chip 120 may be disposed between the circuit substrate 170 located under the first semiconductor chip 120 and the interconnection layer 110 located over the first semiconductor chip 120. In addition, the first semiconductor chip 120 may be surrounded by the outer connectors 160 in a plan view. That is, the first semiconductor chip 120 may be disposed in an inner to space 171 surrounded by the interconnection layer 110, the circuit substrate 170 and the outer connectors 160.

Heat may be generated by an operation of the first semiconductor chip 120 located in the inner space 171, and the heat generated by the operation of the first semiconductor chip 120 may be kept in the inner space 171. However, according to an embodiment, the heat generated by the operation of the first semiconductor chip 120 may be transmitted into an outside region of the semiconductor package 100 through the thermal transfer plate 140. The thermal transfer plate 140 may include a heat conduction material having a thermal conductivity which is higher than a thermal conductivity of the molding layer 150. Thus, the heat generated by the operation of the first semiconductor chip 120 may be rapidly transmitted into an outside region of the semiconductor package 100. Accordingly, since the thermal transfer plate 140 prevents the heat generated by the operation of the first semiconductor chip 120 from being accumulated in the inner space 171, a temperature of the first semiconductor chip 120 may not be excessively raised. That is, the thermal transfer plate 140 may act as a heat conduction path that rapidly transmits the heat generated by the first semiconductor chip 120 into an outside region of the semiconductor package 100. The thermal transfer plate 140 may be formed to include a heat conduction material such as a copper material or an aluminum material having a thermal conductivity which is higher than a thermal conductivity of an EMC material used in formation of the molding layer 150.

Since the first semiconductor chip 120 is disposed in the inner space 171, a first height H1 from the first surface 111 of the interconnection layer 110 to a surface of the first semiconductor chip 120 opposite to the interconnection layer 110 may be less than a second height H2 corresponding to a distance between the interconnection layer 110 and the circuit substrate 170. In order that the first height H1 is less than the second height H2, the first semiconductor chip 120 may have a thickness T which is less than the second height H2 corresponding to a height of each of the outer connectors 160.

Figure 4:
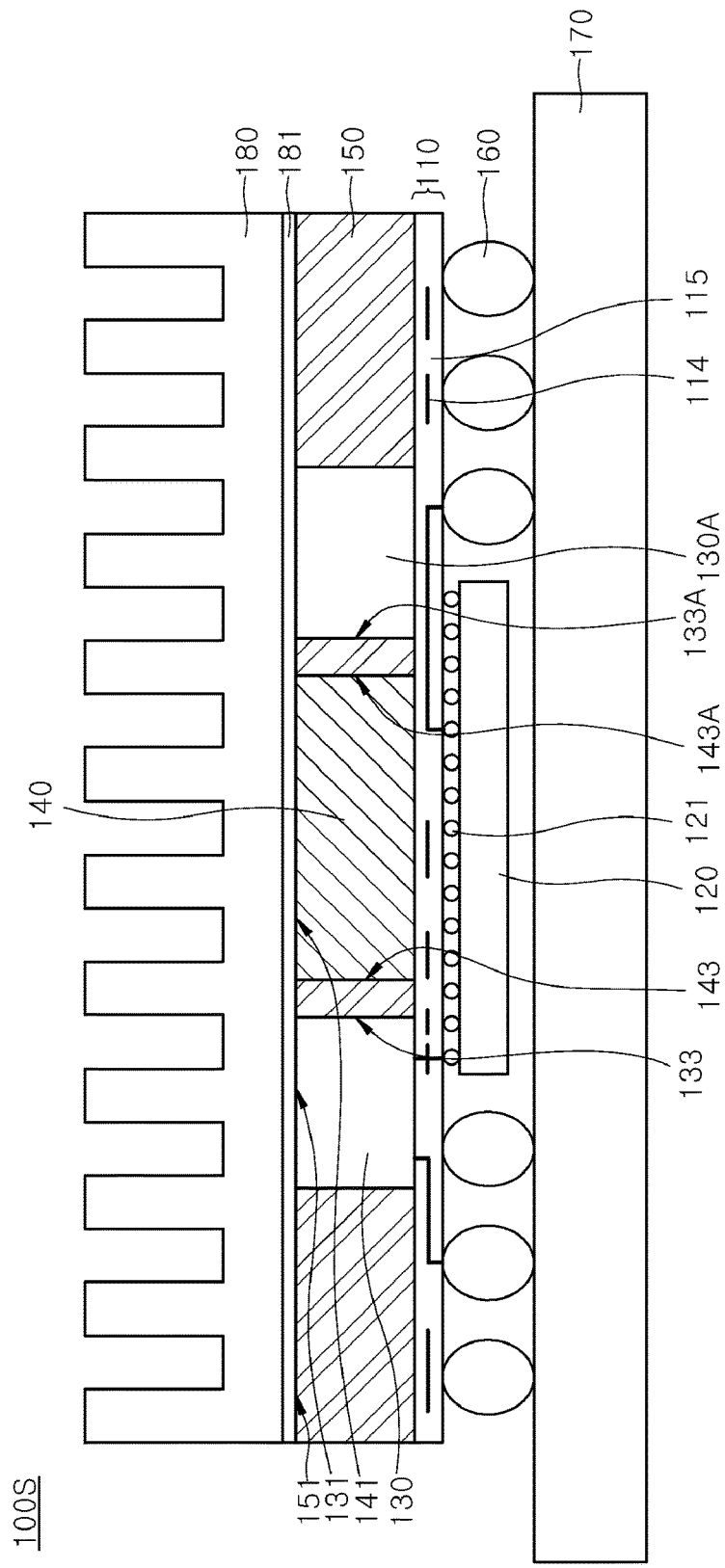
FIG. 4 is a cross-sectional view illustrating a semiconductor package according to an embodiment.

FIG. 4 is a cross-sectional view illustrating a semiconductor package 100S according to an embodiment.

Referring to FIG. 4, the semiconductor package 100S may provide a structure that a heat spreader 180 is additionally attached to the top surface 151 of the molding layer 150 included in the semiconductor package 100 of FIG. 3. The heat spreader 180 may also be attached to the top surface 141 of the thermal transfer plate 140. The heat spreader 180 may radiate the heat transmitted from the thermal transfer plate 140. Thus, the heat generated by the first semiconductor chip 120 may be more effectively radiated through the heat spreader 180. In such a case, a thermal interface material layer 181 may be located at an interface between the heat spreader 180 and the thermal transfer plate 140. The thermal interface material layer 181 may improve heat exchange between the thermal transfer plate 140 and the heat spreader 180.

The heat spreader 180 may extend to be attached to the top surface 131 of the second semiconductor chip 130 and the top surface 151 of the molding layer 150. Since the top surface 131 of the second semiconductor chip 130 is exposed by the molding layer 150, heat exchange between the second semiconductor chip 130 and the heat spreader 180 may more readily occur through the thermal interface material layer 181. The heat spreader 180 and the thermal interface material layer 181 may extend onto the second semiconductor chip 130 and the third semiconductor chip 130A. Accordingly, heat generated by the second and third semiconductor chips 130 and 130A may also be radiated through the heat spreader 180.

The thermal transfer plate 140 may be disposed so that a side surface 143 of the thermal transfer plate 140 faces a side surface 133 of the second semiconductor chip 130. A side surface 143A of the thermal transfer plate 140 opposite to the second semiconductor chip 130 may face a side surface 133A of the third semiconductor chip 130A. The thermal transfer plate 140 may be disposed so that the side surface 143 of the thermal transfer plate 140 is adjacent to the side surface 133 of the second semiconductor chip 130. Thus, the heat generated by the operation of the second semiconductor chip 130 may be transmitted to the thermal transfer plate 140 through the side surface 133 of the second semiconductor chip 130, and the heat transmitted to the thermal transfer plate 140 may be conducted to the heat spreader 180 and may be radiated into an outside region of the semiconductor package 100. Thus, the heat generated by the operation of the third semiconductor chip 130A may be transmitted to the thermal transfer plate 140 through the side surface 133A of the third semiconductor chip 130A, and the heat transmitted to the thermal transfer plate 140 may be conducted to the heat spreader 180 and may be radiated into an outside region of the semiconductor package 100. As such, the heat spreader 180 may more effectively improve a cooling efficiency of the semiconductor package 100S.

Referring again to FIG. 2, since the first semiconductor chip 120 of the semiconductor package 100 can be cooled down by the thermal transfer plate 140, the first semiconductor chip 120 may be disposed on the first surface 111 of the interconnection layer 110. In addition, since the second semiconductor chip 130 is disposed on the second surface 112 of the interconnection layer 110 opposite to the first semiconductor chip 120, at least a portion of the second semiconductor chip 130 may overlap with at least a portion of the first semiconductor chip 120 in a plan view. That is, since at least a portion of the second semiconductor chip 130 can be stacked over at least a portion of the first semiconductor chip 120, a total width of the semiconductor package 100 may be reduced as compared with a case that the first and second semiconductor chips 120 and 130 are disposed side-by-side when viewed from a plan view.

Since the second semiconductor chip 130 is stacked over the first semiconductor chip 120 so that at least a portion of the second semiconductor chip 130 overlaps with at least a portion of the first semiconductor chip 120 in a plan view, lengths of signal routing paths disposed between the first and second semiconductor chips 120 and 130 may be reduced. The interconnection layer 110 may include redistribution patterns 114 and a dielectric layer 115 covering the redistribution patterns 114 to insulate the redistribution patterns 114 from each other. In such a case, at least a portion of the second semiconductor chip 130 may overlap with at least a portion of the first semiconductor chip 120 in a plan view. Accordingly, lengths of the redistribution patterns 114 for connecting the first and second semiconductor chips 120 and 130 to each other may be reduced.

Figure 5:
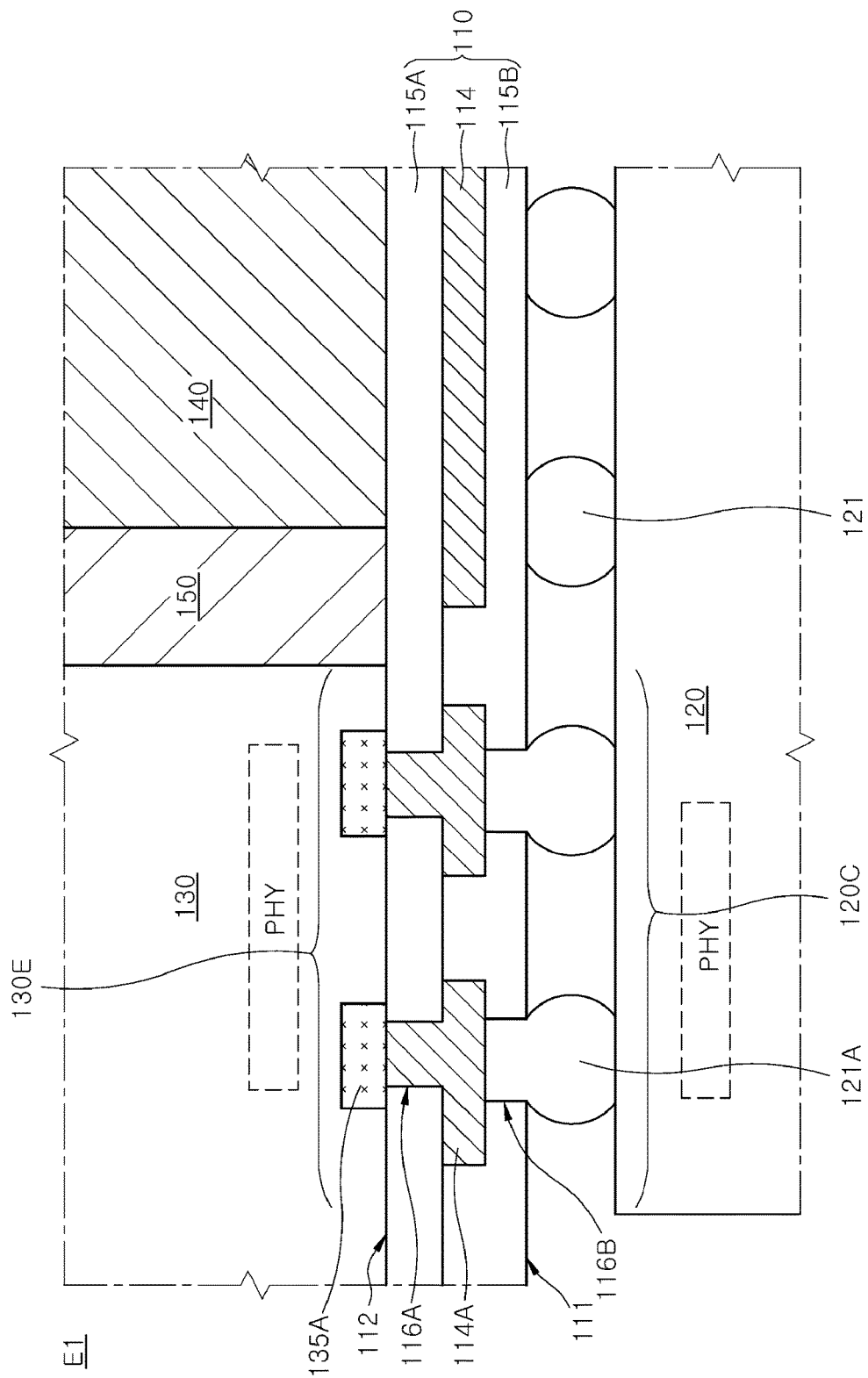
FIGS. 5 to 7 are cross-sectional views illustrating a configuration of an interconnection layer included in a semiconductor package according to an embodiment.
Figure 6:
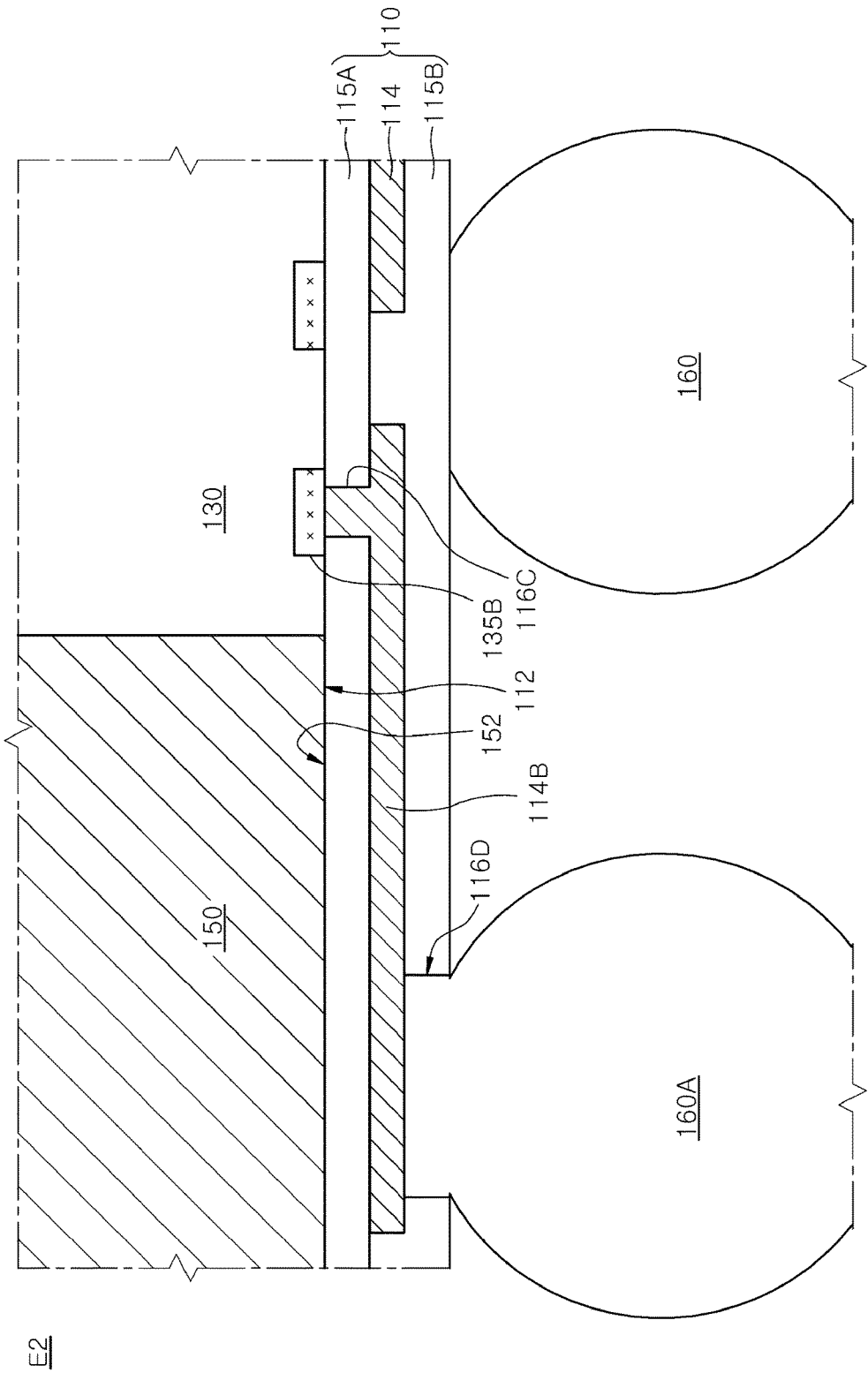
Figure 7:
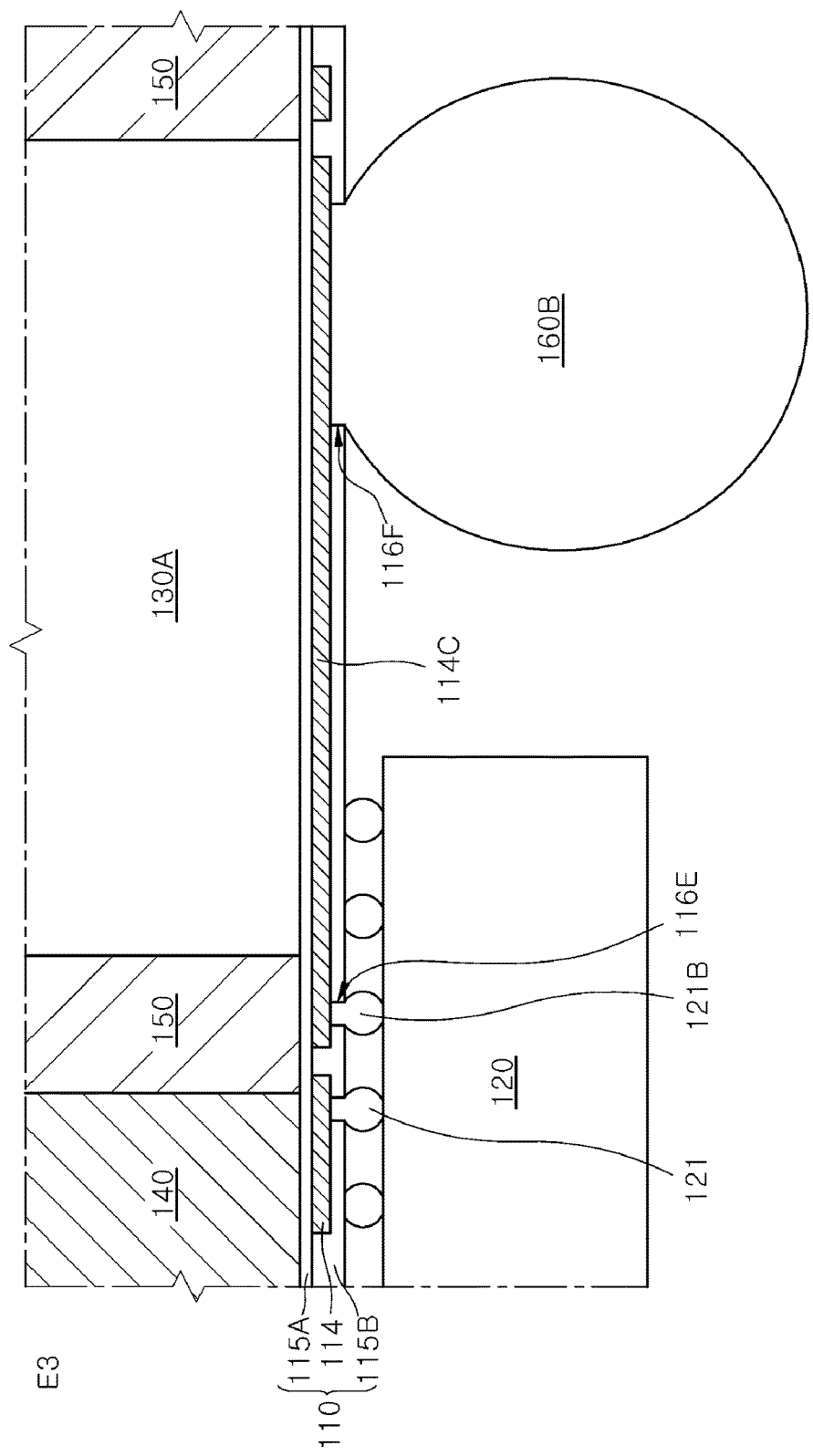

FIGS. 5 to 7 are cross-sectional views illustrating an example of the interconnection layer 110 included in any one of the semiconductor packages 100 and 100S illustrated in FIGS. 1 to 4. FIGS. 5 to 7 are enlarged views illustrating some portions of the semiconductor package 100 illustrated in FIG. 2, respectively.

FIG. 5 is an enlarged cross-sectional view illustrating a portion 'E1' of FIG. 2. The interconnection layer 110 may include a first dielectric layer 115A electrically insulating the redistribution patterns 114 from the thermal transfer plate 140. The interconnection layer 110 may further include a second dielectric layer 115B electrically insulating the redistribution patterns 114 from each other. The first and second dielectric layers 115A and 115B may be laminated to contact each other and to provide the dielectric is layer (115 of FIG. 2). Since the interconnection layer 110 is configured to include the dielectric layer (115 of FIG. 2) and the redistribution patterns 114, the interconnection layer 110 may have a thickness which is less than a thickness of a general PCB. Thus, a total thickness of the semiconductor package (100 of FIG. 2) may be reduced.

An edge region (substantially, one of the corner regions 1200) of the first semiconductor chip 120 may vertically overlap with the edge region 130E of the second semiconductor chip 130. A physical layer PHY having an interface structure for signal transmission between the first and second semiconductor chips 120 and 130 may be disposed in the corner region 120C of the first semiconductor chip 120, and another physical layer PHY having an interface structure for signal transmission between the first and second semiconductor chips 120 and 130 may also be disposed in the edge region 130E of the second semiconductor chip 130.

In an embodiment, first chip pads 135A may be disposed on the edge region 130E of the second semiconductor chip 130 to electrically connect the second semiconductor chip 130 to the first to semiconductor chip 120. In addition, first inner connectors 121A may be disposed on the corner region 120C of the first semiconductor chip 120 to electrically connect the first semiconductor chip 120 to the second semiconductor chip 130. The first inner connectors 121A may correspond to some of the inner connectors 121.

First redistribution patterns 114A may be disposed in the interconnection layer 110 so that first ends of the first redistribution patterns 114A are electrically connected to the first chip pads 135A of the second semiconductor chip 130 and second ends of the first redistribution patterns 114A are electrically connected to the first inner connectors 121A. The first redistribution patterns 114A may correspond to some of the redistribution patterns 114 and may be disposed between the edge region 130E of the second semiconductor chip 130 and the corner region 120C of the first semiconductor chip 120.

The first redistribution patterns 114A may act as vertical signal paths that substantially and vertically connect the edge region 130E of the second semiconductor chip 130 to the corner region 120C of the first semiconductor chip 120. The first redistribution patterns 114A may be disposed to overlap with the edge region 130E of the second semiconductor chip 130 and the corner region 120C of the first semiconductor chip 120 in a plan view. Thus, according to an embodiment, lengths of the first redistribution patterns 114A may be reduced and routing lengths of the signal paths between the first and second semiconductor chips 120 and 130 may also be reduced.

The first dielectric layer 115A may be formed to have first openings 116A for exposing the first chip pads 135A in order to connect the first ends of the first redistribution patterns 114A to the first chip pads 135A. The first ends of the first redistribution patterns 114A may fill the first openings 116A to be connected to the first chip pads 135A. The second dielectric layer 115B may be formed to have second openings 116B for exposing the second ends of the first redistribution patterns 114A in order to connect the second ends of the first redistribution patterns 114A to the first inner connectors 121A. The first inner connectors 121A may extend to fill the second openings 1163 to be connected to the first redistribution patterns 114A.

FIG. 6 is an enlarged cross-sectional view illustrating a portion 'E2' of FIG. 2. A second redistribution pattern 114B corresponding to one of the redistribution patterns 114 may extend from a region overlapping with the second semiconductor chip 130 into an outside region of the second semiconductor chip 130 in a plan view. The second redistribution pattern 114B may extend into a region overlapping with the molding layer 150 in a plan view. Thus, a first outer connector 160A corresponding to one of the outer connectors 160 may be connected to the second redistribution pattern 1143 and may be disposed to overlap with a portion of the molding layer 150 located at an outside region of the second semiconductor chip 130 in a plan view. As a result, the first outer connector 160A may be a connector that electrically connects the second semiconductor chip 130 to an external device.

The second redistribution pattern 1143 may extend into an outside region of the second semiconductor chip 130 to connect the first outer connector 160A to a second chip pad 1353 corresponding to one of the chip pads of the second semiconductor chip 130. As the second redistribution pattern 1143 extends into an outside region of the second semiconductor chip 130, the first dielectric layer 115A may also extend to be in contact with a bottom surface 152 of the molding layer 150.

The second redistribution pattern 114B may be disposed in the interconnection layer 110 so that a first end of the second redistribution pattern 114B is electrically connected to the second chip pad 135B of the second semiconductor chip 130 and a second end of the second redistribution pattern 114B is electrically connected to the first outer connector 160A. The first dielectric layer 115A may be formed to have a third opening 116C for exposing the second chip pad 135B in order to connect the first end of the second redistribution pattern 114B to the second chip pad 135B. The first end of the second redistribution pattern 114B may fill the third opening 116C to be connected to the second chip pad 135B. The second dielectric layer 115B may be formed to have a fourth opening 116D for exposing the second end of the second redistribution pattern 114B in order to connect the second end of the second redistribution pattern 114B to the first outer connector 160A. The first outer connector 160A may extend to fill the fourth opening 116D to be connected to the second redistribution pattern 114B.

FIG. 7 is an enlarged cross-sectional view illustrating a portion 'E3' of FIG. 2. A third redistribution pattern 114C corresponding to one of the redistribution patterns 114 may extend from a region overlapping with the third semiconductor chip 130A into an outside region of the third semiconductor chip 130A in a plan view. Thus, a second outer connector 160B corresponding to one of the outer connectors 160 may be connected to the third redistribution pattern 114C and may be disposed to overlap with the third semiconductor chip 130A. In an embodiment, the other outer connector 160 connected to the third redistribution pattern 114C may be disposed to overlap with the molding layer 150, as illustrated in FIG. 2. The second outer connector 160B may be a connector that electrically connects the first semiconductor chip 120 to an external device.

The third redistribution pattern 114C may extend into an outside region of the first semiconductor chip 120 to connect the second outer connector 160B to a second inner connector 1213 corresponding to one of the inner connectors 121 connected to the first semiconductor chip 120. As the third redistribution pattern to 114C extends into an outside region of the first semiconductor chip 120, the first dielectric layer 115A may also extend to overlap with the third semiconductor chip 130A.

The third redistribution pattern 114C may be disposed in the interconnection layer 110 so that a first end of the third redistribution pattern 114C is electrically connected to the second inner connector 1213 and a second end of the third redistribution pattern 114C is electrically connected to the second outer connector 1603. The second dielectric layer 1153 may be formed to have a fifth opening 116E for exposing the first end of the third redistribution pattern 114C in order to connect the first end of the third redistribution pattern 114C to the second inner connector 121B. The second inner connector 121B may extend to fill the fifth opening 116E to be connected to the first end of the third redistribution pattern 114C. The second dielectric layer 115B may be formed to have a sixth opening 116F for exposing the second end of the third redistribution pattern 114C in order to connect the second end of the third redistribution pattern 114C to the second outer connector 160B. The second outer connector 160B may extend to fill the sixth opening 116F to be connected to the second end of the third redistribution pattern 1140.

As such, the redistribution patterns 114 may include the first to third redistribution patterns 114A, 114B and 114C having different shapes.

Figure 8:
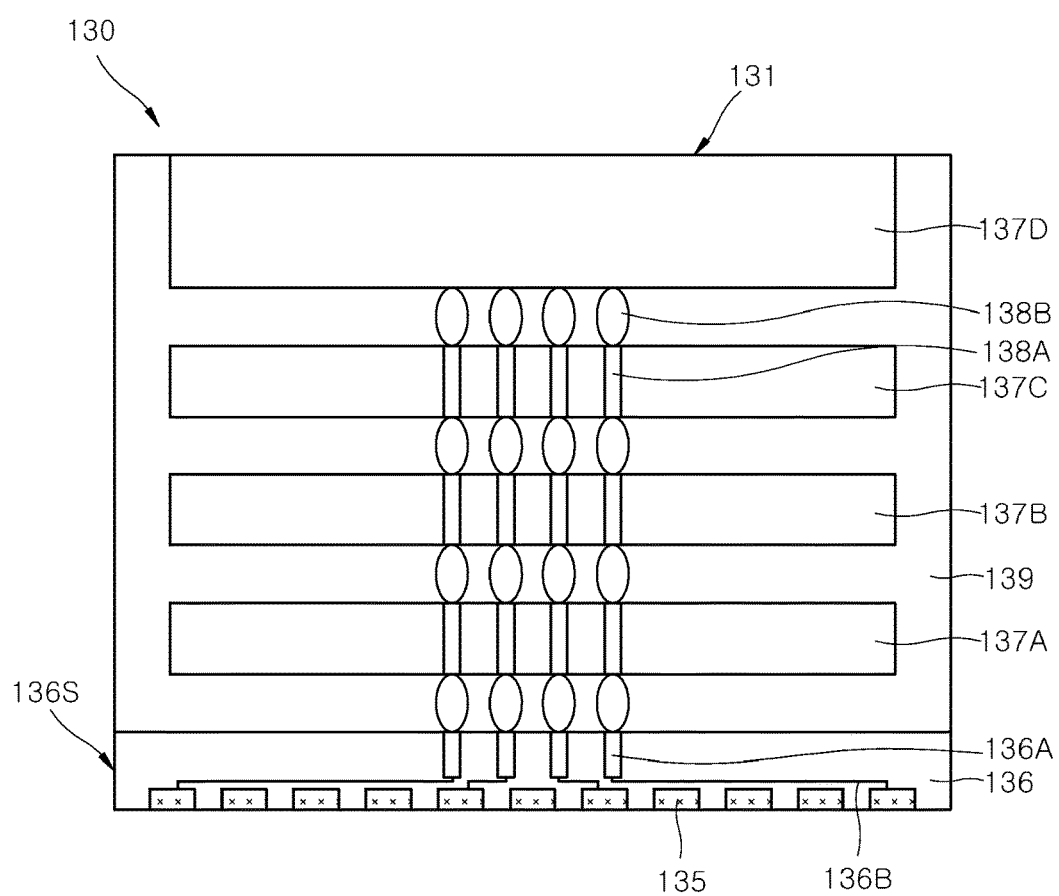
FIG. 8 is a cross-sectional view illustrating a semiconductor chip included in a semiconductor package according to an embodiment.

FIG. 8 is a cross-sectional view illustrating the second semiconductor chip 130 in FIG. 2.

Referring to FIGS. 2 and 8, the second semiconductor chip 130 may include a plurality of semiconductor dies which are vertically stacked. For example, the second semiconductor chip 130 may is include a base logic semiconductor die 136 and first to fourth semiconductor dies 137A, 137B, 137C and 137D which are sequentially stacked on the base logic semiconductor die 136. The second semiconductor chip 130 including the base logic semiconductor die 136 and the first to fourth semiconductor dies 137A, 137B, 137C and 137D may function as a high performance memory device such as a high bandwidth memory (HBM) device. Each of the third to fifth semiconductor chips (130A, 130B and 130C of FIG. 1) may be provided to have substantially the same configuration and function as the second semiconductor chip 130.

The base logic semiconductor die 136 and the first to fourth semiconductor dies 137A, 137B, 137C and 137D may be electrically connected to each other by inter-die connectors 138B. The inter-die connectors 138B may include micro-bumps. Each of the first to third core semiconductor dies 137A, 137B and 137C may include first through silicon vias (TSVs) 138A penetrating a body thereof, and the first through silicon vias (TSVs) 138A of the first to third core semiconductor dies 137A, 137B and 137C may be vertically connected by the inter-die connectors 138B to constitute input/output (I/O) paths. No through silicon via (TSV) may be included in the fourth core semiconductor die 137D corresponding to a topmost semiconductor die among the first to fourth semiconductor dies 137A, 137B, 137C and 137D. However, in some other embodiments, the fourth core semiconductor die 137D may also is include the through silicon vias (TSVs).

The first to fourth core semiconductor dies 137A, 137B, 137C and 137D may include substantially the same integrated circuit to perform the same operation. The first to fourth core semiconductor dies 137A, 137B, 137C and 137D may include DRAM cells to provide data banks. The base logic semiconductor die 136 may control operations of the first to fourth core semiconductor dies 137A, 137B, 137C and 137D.

The base logic semiconductor die 136 may include second through silicon vias (TSVs) 136A which are coupled to the first TSVs 138A of the first core semiconductor die 137A by the inter-die connectors 138B. The base logic semiconductor die 136 may include chip pads 135 that electrically connect the second semiconductor chip 130 to the interconnection layer (110 of FIG. 2). The chip pads 135 may include the first chip pads 135A illustrated in FIG. 5 and the second chip pads 135B illustrated in FIG. 6. The base logic semiconductor die 136 may further include internal interconnection lines 136B that connect the second TSVs 136A to the chip pads 135.

The second semiconductor chip 130 and the third to fifth to semiconductor chips (130A, 130B and 130C of FIG. 1) may provide a memory device, and the first semiconductor chip (120 of FIG. 2) may be a processor such as a central processing unit (CPU) or a graphic processing unit (GPU). In such a case, the semiconductor package 100 of FIG. 1 or the semiconductor package 100S of FIG. 4 may is correspond to a system-on-chip (SoC). Thus, the first and second semiconductor chips 120 and 130 may transmit data to each other at a high speed with a wide bandwidth.

The second semiconductor chip 130 may further include an inner protection layer 139 that covers and protects the base logic semiconductor die 136 and the first to fourth core semiconductor dies 137A, 137B, 137C and 137D, The inner protection layer 139 may be formed to include an encapsulant such as an EMC material or an underfill material. The inner protection layer 139 may be formed to expose side surfaces 136S of the base logic semiconductor die 136 and to cover side surfaces of the first to fourth core semiconductor dies 137A, 137B, 137C and 137D. The inner protection layer 139 may be formed to expose a top surface of the fourth core semiconductor die 137D, that is, the top surface 131 of the second semiconductor chip 130.

FIGS. 9 to 14 are cross-sectional views illustrating a method of manufacturing a semiconductor package according to an embodiment.

Figure 9:
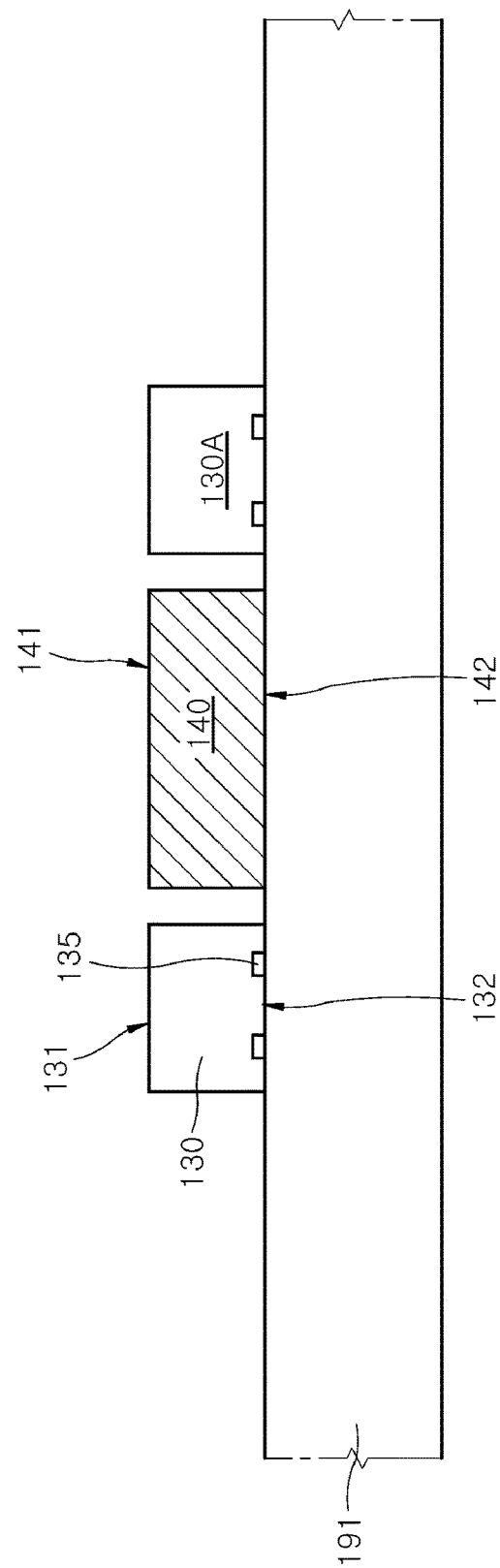
FIGS. 9 to 14 are cross-sectional views illustrating a method of manufacturing a semiconductor package according to an embodiment.

Referring to FIG. 9, the second semiconductor chip 130, the thermal transfer plate 140 and the third semiconductor chip 130A may be disposed on a first carrier 191. The thermal transfer plate 140 may be disposed between the second semiconductor chip 130 and the third semiconductor chip 130A which are spaced apart from each other. In such a case, as illustrated in FIG. 1, the fourth and fifth semiconductor chips (130B and 130C of FIG. 1) may also be disposed to be spaced apart from the second semiconductor chip 130 and the third semiconductor chip 130A. The second semiconductor chip 130 may be mounted on the first carrier 191 so that the chip pads 135 on a bottom surface 132 of the second semiconductor chip 130 face a surface of the first carrier 191. Accordingly, the top surface 131 of the second semiconductor chip 130 may be located at an opposite side of the first carrier 191.

The second semiconductor chip 130, the thermal transfer plate 140 and the third semiconductor chip 130A may be temporarily attached to a surface of the first carrier 191 using an adhesive layer. The first carrier 191 may be used as a supporter for supporting the second semiconductor chip 130, the thermal transfer plate 140 and the third semiconductor chip 130A in subsequent process. The first carrier 191 may have a wafer form so that a wafer level packaging technique is applied to the first carrier 191.

Figure 10:
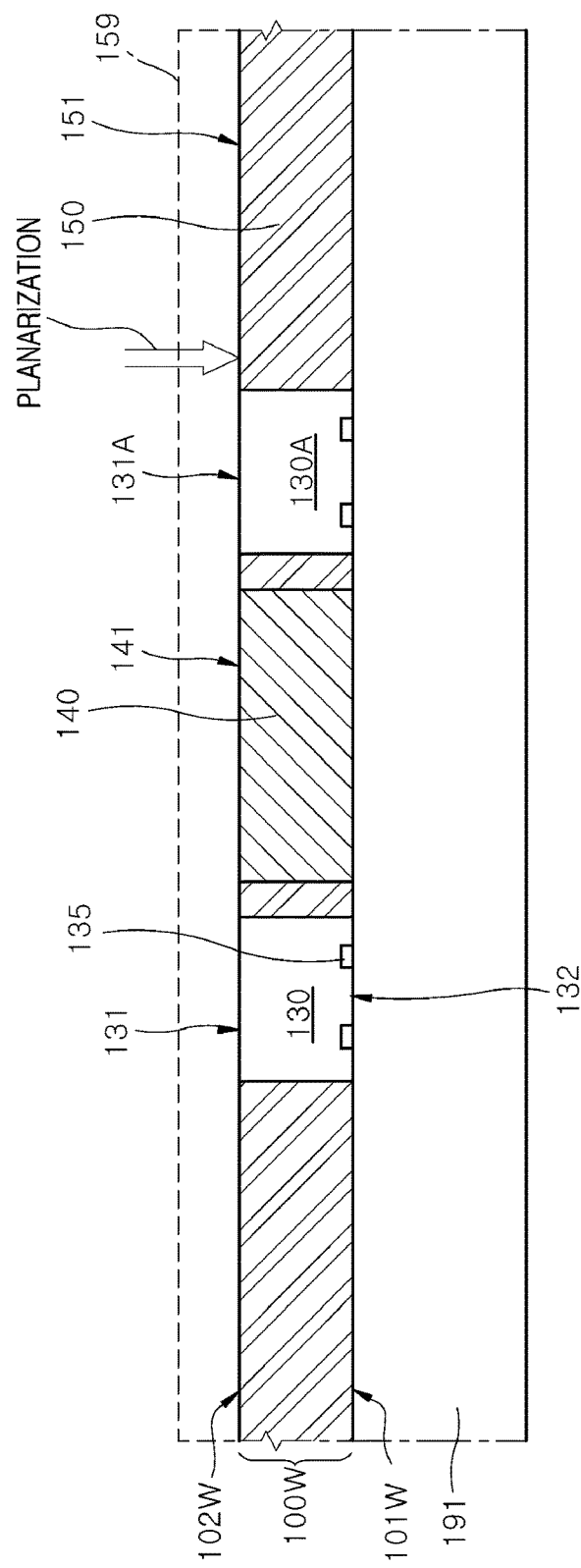

Referring to FIG. 10, an initial molding layer 159 may be formed on the first carrier 191 to cover the second semiconductor chip 130, the thermal transfer plate 140 and the third semiconductor chip 130A. The initial molding layer 159 may fix relative positions of the second semiconductor chip 130, the thermal transfer plate 140 and the third semiconductor chip 130A. The initial molding layer 159 may be formed of an encapsulant layer to protect the second semiconductor chip 130, the thermal transfer plate 140 and the third is semiconductor chip 130A.

A planarization process may be applied to a top surface of the initial molding layer 159 to remove an upper portion of the initial molding layer 159. The planarization process may be performed using a removal process such as a grinding process. The upper portion of the initial molding layer 159 may be selectively removed by the planarization process to provide the molding layer 150 having a reduced thickness and a planarized surface. The planarization process may be performed to expose the top surface 141 of the thermal transfer plate 140. In addition, after the planarization process is performed, the top surface 131 of the second semiconductor chip 130 may be exposed and a top surface 131A of the third semiconductor chip 130A may also be exposed.

The molding layer 150 may fix the second semiconductor chip 130, the thermal transfer plate 140 and the third semiconductor chip 130A to the first carrier 191 to form a reconstruction wafer 100W, The reconstruction wafer 100W may be configured to include the molding layer 150 filling gaps between the second semiconductor chip 130, the thermal transfer plate 140 and the third semiconductor chip 130A. The reconstruction wafer 100W may have a wafer shape to be handled by apparatuses processing semiconductor wafers. That is, the reconstruction wafer 100W may be a wafer-shaped layer having a first surface 101W and a second surface 102W which are opposite to each other. Thus, it may be possible to form a is redistribution layer and bumps on the reconstruction wafer 100W using various semiconductor processes.

After the reconstruction wafer 100W is formed, the first carrier 191 may be detached from the reconstruction wafer 100W.

Figure 11:
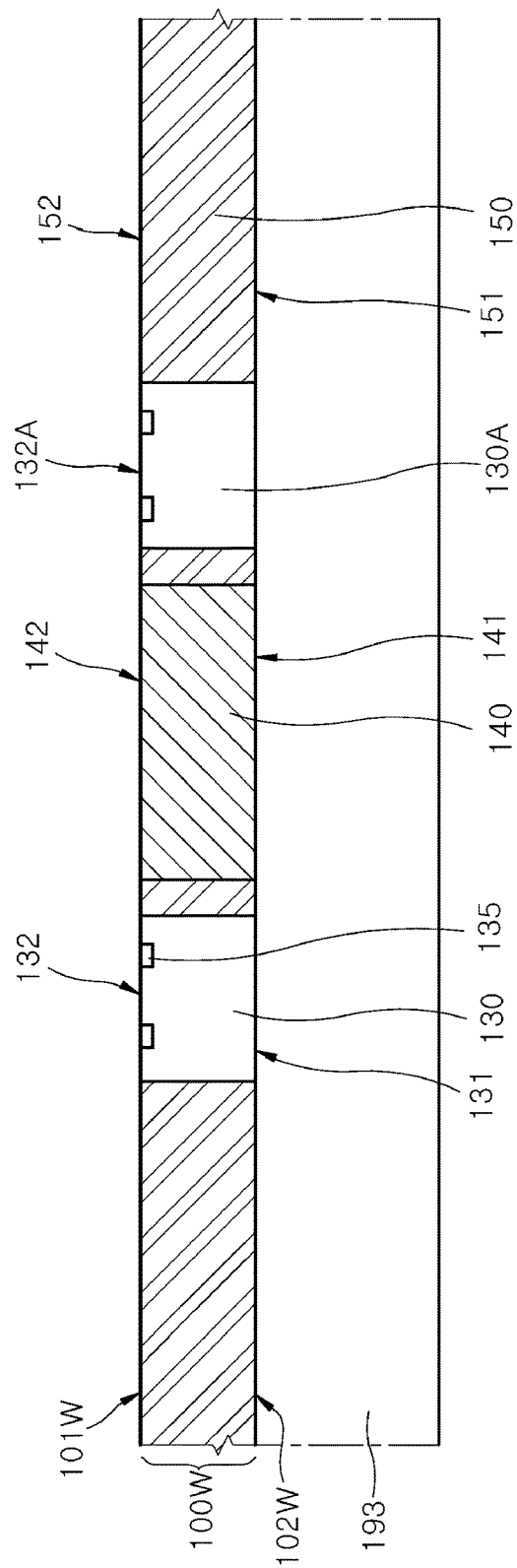

Referring to FIG. 11, the reconstruction wafer 100W may be flipped so that the first surface 101W of the reconstruction wafer 100W is located at a level which is higher than the second surface 102W of the reconstruction wafer 100W. A second carrier 193 may then be attached to the second surface 102W of the reconstruction wafer 100W to support the reconstruction wafer 100W. In some other embodiments, it may be possible to omit the process for attaching the second carrier 193 to the reconstruction wafer 100W. The bottom surface 152 of the molding layer 150 opposite to the second carrier 193 may be exposed at the first surface 101W of the reconstruction wafer 100W. In addition, the bottom surface 132 of the second semiconductor chip 130 opposite to the second carrier 193 may be exposed at the first surface 101W of the reconstruction wafer 100W. Moreover, the bottom surface 142 of the thermal transfer plate 140 opposite to the second carrier 193 may also be exposed at the first surface 101W of the reconstruction wafer 100W. Also, the bottom surface 132A of the third semiconductor chip 130 opposite to the second carrier 193 may be exposed at the first surface 101W of the reconstruction wafer 100W.

Figure 12:
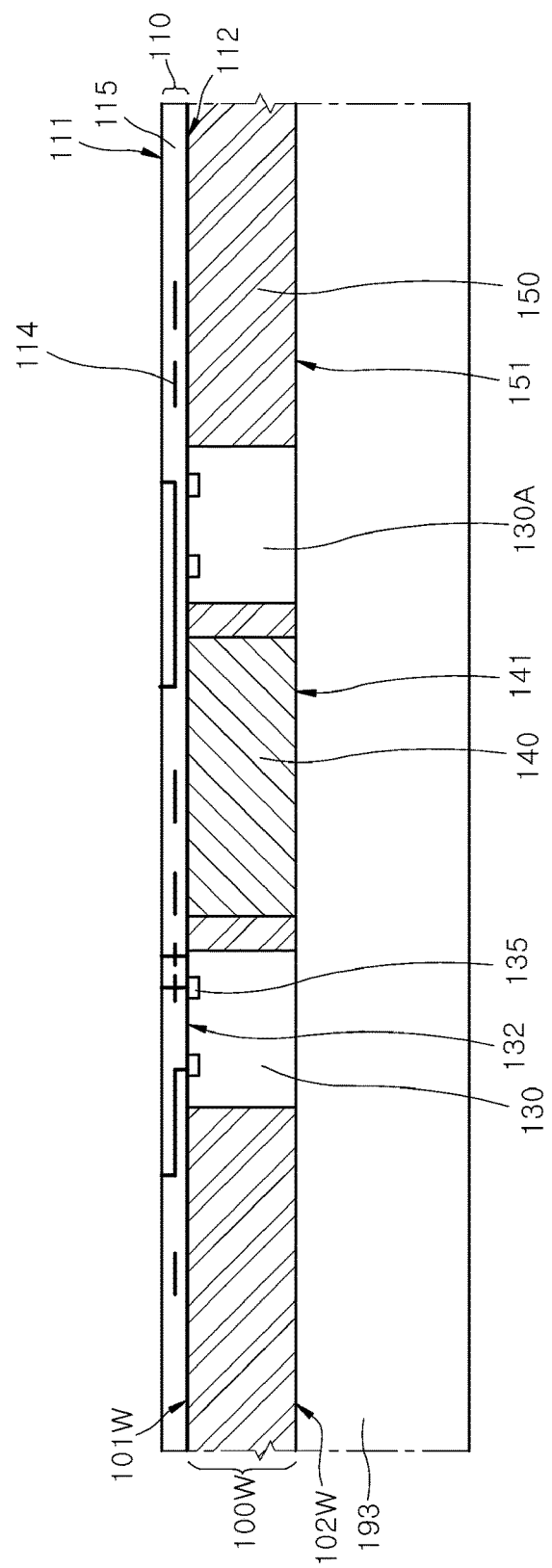

Referring to FIG. 12, the interconnection layer 110 may be formed on the first surface 101W of the reconstruction wafer 100W. The interconnection layer 110 may be provided to include the dielectric layer 115 and the redistribution patterns 114 embedded in the dielectric layer 115. The interconnection layer 110 may be formed on the reconstruction wafer 100W so that the second surface 112 of the interconnection layer 110 is in contact with the first surface 101W of the reconstruction wafer 100W and the first surface 111 of the interconnection layer 110 is exposed. Some of the redistribution patterns 114 in the dielectric layer 115 may be formed to be electrically connected to the second semiconductor chip 130.

Figure 13:
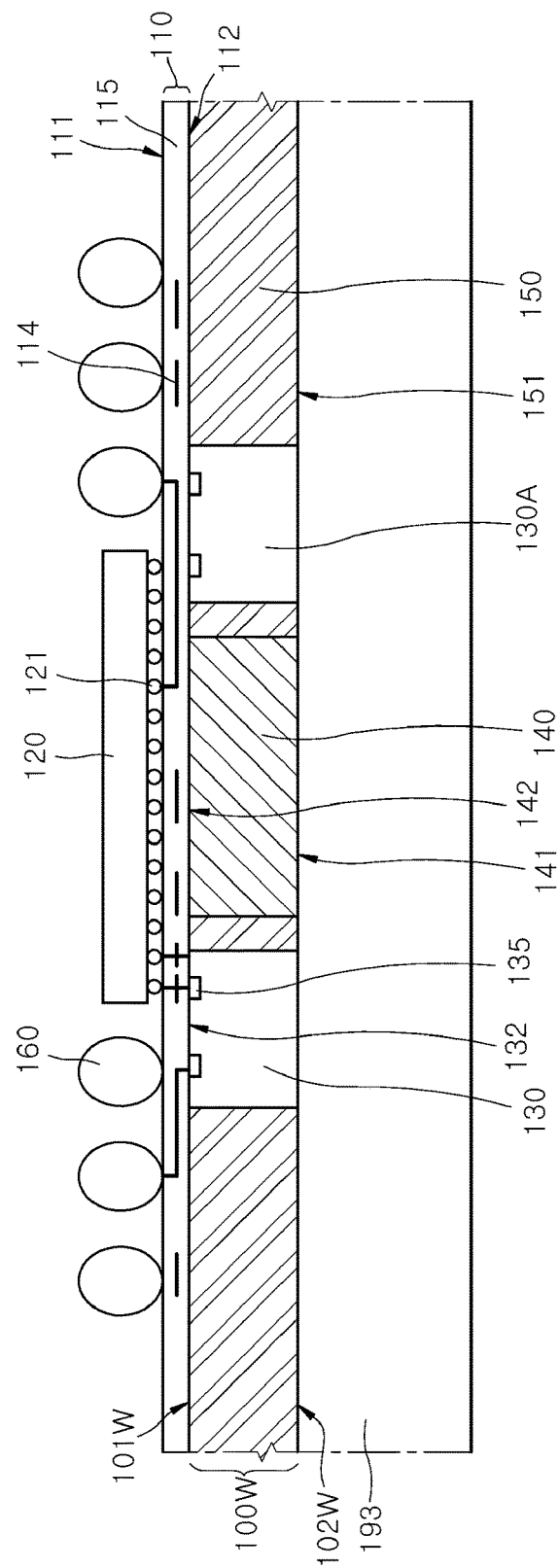

Referring to FIG. 13, the first semiconductor chip 120 may be mounted on the first surface 111 of the interconnection layer 110 using the inner connectors 121. In such a case, the inner connectors 121 may be in contact with the interconnection layer 110 to be electrically connected to some of the redistribution patterns 114. The outer connectors 160 may be attached to the first surface 111 of the interconnection layer 110. The outer connectors 160 may be attached to the interconnection layer 110 to be electrically connected to some of the redistribution patterns 114 in the interconnection layer 110.

In the event that the second carrier 193 is attached to the reconstruction wafer 100W in the previous process, the second carrier 193 may be detached from the reconstruction wafer 100W after the outer connectors 160 are attached to the interconnection is layer 110.

Figure 14:
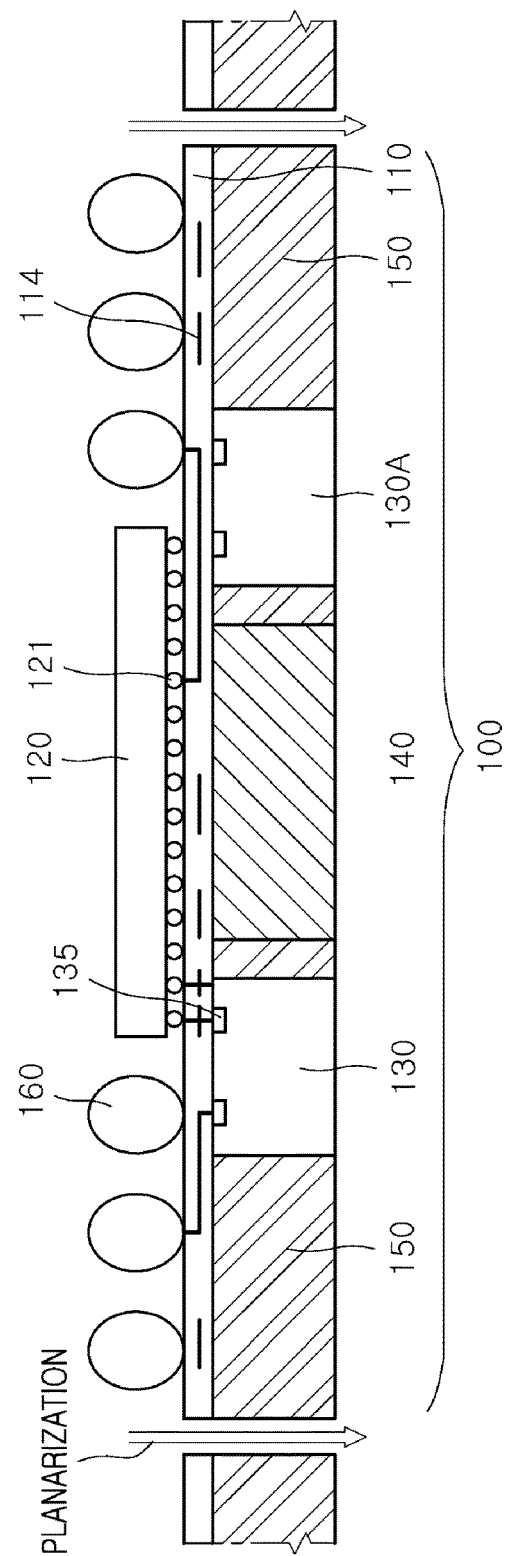

Referring to FIG. 14, a singulation process may be performed using a die sawing technique to separate the semiconductor packages 100 from each other. As illustrated in FIG. 4, the heat spreader (180 of FIG. 4) may be additionally attached to each semiconductor package 100 using the thermal interface material layer (181 of FIG. 4).

According to the embodiments described above, there are provided semiconductor packages, each of which is configured to include a plurality of semiconductor chips that are three-dimensionally stacked on and under an interconnection layer. The interconnection layer may be configured to include redistribution patterns extending into an outside region of the semiconductor chips in a plan view, Since one of the semiconductor chips is disposed to vertically and partially overlap with the remaining semiconductor chips, lengths of routing paths between physical layers included in the semiconductor chips may be reduced and a planar area of each of the semiconductor packages may also be reduced.

Each of the semiconductor packages may further include a thermal transfer plate overlapping with any one of the plurality of semiconductor chips. The thermal transfer plate may penetrate a molding layer of the semiconductor package to provide a heat conduction path that extends from the interconnection layer to reach a top surface of the semiconductor package. Thus, the thermal transfer plate may improve a cooling efficiency of the semiconductor package.

Figure 15:
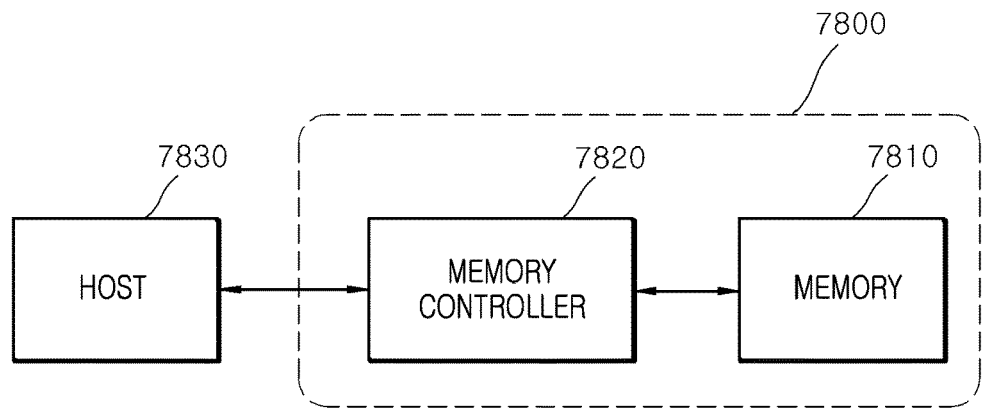
FIG. 15 is a block diagram illustrating an electronic system employing a memory card including a semiconductor package to according to an embodiment.

FIG. 15 is a block diagram illustrating an electronic system including a memory card 7800 employing at least one of the semiconductor packages according to the embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 16:
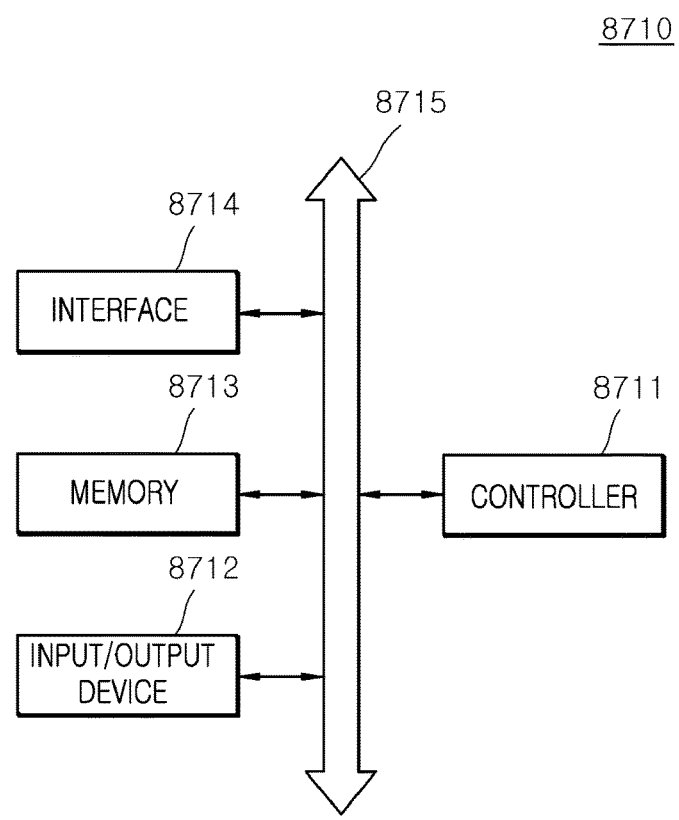
FIG. 16 is a block diagram illustrating an electronic system including a semiconductor package according to an embodiment.

FIG. 16 is a block diagram illustrating an electronic system 8710 including at least one of the semiconductor packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected from a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system with a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a first semiconductor chip disposed on a first surface of an interconnection layer;
    a second semiconductor chip and a third semiconductor chip spaced apart from each other and disposed on a second surface of the interconnection layer; and
    a thermal transfer plate disposed between the second and third semiconductor chips, contacting the second surface of the interconnection layer, and overlapping with the first semiconductor chip,
    wherein the thermal transfer plate provides a heat radiation path.

2. The semiconductor package of claim 1,
    wherein the thermal transfer plate has a bottom surface which is in contact with the second surface of the interconnection layer; and
    wherein the thermal transfer plate has one side surface that faces a side surface of the second semiconductor chip and another side surface that faces a side surface of the third semiconductor chip.

3. The semiconductor package of claim 1, further comprising a molding layer that covers the second surface of the interconnection layer and side surfaces of the second and third semiconductor chips and fills a gap between the second semiconductor chip and the thermal transfer plate.

4. The semiconductor package of claim 1, further comprising a heat spreader attached to the thermal transfer plate.

5. The semiconductor package of claim 1, wherein the second semiconductor chip has an edge region overlapping with a corner region of the first semiconductor chip.

6. The semiconductor package of claim 1, further comprising outer connectors attached to the first surface of the interconnection layer.

7. The semiconductor package of claim 3,
    wherein the thermal transfer plate is disposed to penetrate the molding layer; and
    wherein the molding layer exposes a top surface of the thermal transfer plate.

8. The semiconductor package of claim 3, wherein the interconnection layer includes:
    redistribution patterns extending from a portion of the interconnection layer overlapping with the second semiconductor chip into another portion of the interconnection layer overlapping with the molding layer; and
    a dielectric layer insulating the redistribution patterns from each other.

9. The semiconductor package of claim 7, wherein the molding layer is disposed to expose a top surface of the second semiconductor chip.

10. The semiconductor package of claim 4, wherein the heat spreader extends to be in contact with a top surface of the second semiconductor chip.

11. The semiconductor package of claim 4, further comprising a thermal interface material layer disposed between the heat spreader and the thermal transfer plate.

12. The semiconductor package of claim 5, wherein the interconnection layer includes first redistribution patterns that overlap with both of the corner region of the first semiconductor chip and the edge region of the second semiconductor chip and the first redistribution patterns electrically and vertically connect the first semiconductor chip to the second semiconductor chip.

13. The semiconductor package of claim 5, wherein a physical layer having an interface structure for signal transmission between the first and second semiconductor chips is disposed in the corner region of the first semiconductor chip and another physical layer having an interface structure for signal transmission between the first and second semiconductor chips is disposed in the edge region of the second semiconductor chip.

14. The semiconductor package of claim 13, wherein the interconnection layer further includes a third redistribution pattern that electrically connects the second semiconductor chip to one of the outer connectors.

15. The semiconductor package of claim 13, wherein the outer connectors are disposed to surround side surfaces of the first semiconductor chip.

16. The semiconductor package of claim 13, wherein a height from the first surface of the interconnection layer to a surface of the first semiconductor chip opposite to the interconnection layer is less than a height of the outer connectors attached to the first surface of the interconnection layer.

17. The semiconductor package of claim 6, wherein the interconnection layer includes a second redistribution pattern that electrically connects one of the outer connectors to the second semiconductor chip.

18. The semiconductor package of claim 17,
wherein the interconnection layer includes a dielectric layer having a first opening that exposes the chip pad of the second semiconductor chip and a second opening that exposes the second end of the second redistribution pattern; and
wherein the first opening is filled with the first end of the second redistribution pattern and the second opening is filled with the one outer connector.

19. The semiconductor package of claim 17, wherein the second redistribution pattern extends so that a first end of the second redistribution pattern is connected to a chip pad of the second semiconductor chip and a second end of the second redistribution pattern is connected to one of the outer connectors.

20. A semiconductor package comprising:
a first semiconductor chip disposed on a first surface of an interconnection layer;
second semiconductor chips disposed on a second surface of the interconnection layer so that four corner regions of the first semiconductor chip respectively overlap with edge regions of the second semiconductor chips; and
a thermal transfer plate disposed between the second semiconductor chips to contact the second surface of the interconnection layer and to overlap with the first semiconductor chip,
wherein the thermal transfer plate provides a heat radiation path.

* * * * *